United States Patent
Junnarkar et al.

(10) Patent No.: US 12,381,472 B2
(45) Date of Patent: Aug. 5, 2025

(54) GATE DRIVER CIRCUIT

(71) Applicant: TEXAS INSTRUMENTS INCORPORATED, Dallas, TX (US)

(72) Inventors: Avadhut Junnarkar, McKinney, TX (US); Mustapha El-Markhi, Richardson, TX (US); Neeraj Keskar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 296 days.

(21) Appl. No.: 18/146,512

(22) Filed: Dec. 27, 2022

(65) Prior Publication Data
US 2024/0213874 A1    Jun. 27, 2024

(51) Int. Cl.
| | |
|---|---|
| H02M 3/155 | (2006.01) |
| H02M 1/00 | (2006.01) |
| H02M 1/08 | (2006.01) |
| H03K 3/012 | (2006.01) |
| H03K 3/037 | (2006.01) |
| H03K 19/0175 | (2006.01) |
| H03K 17/16 | (2006.01) |

(52) U.S. Cl.
CPC ........... *H02M 1/0054* (2021.05); *H02M 1/08* (2013.01); *H02M 3/155* (2013.01); *H03K 3/012* (2013.01); *H03K 3/037* (2013.01); *H03K 19/017509* (2013.01); *H03K 17/162* (2013.01)

(58) Field of Classification Search
CPC ....... H02M 1/0054; H02M 1/08; H02M 3/155
See application file for complete search history.

(56) References Cited

U.S. PATENT DOCUMENTS

| | | | |
|---|---|---|---|
| 9,831,867 B1 | 11/2017 | Kinzer | |
| 11,641,198 B1* | 5/2023 | Hashim | H03K 17/0822 327/109 |
| 2016/0277012 A1 | 9/2016 | Abesingha | |
| 2020/0195121 A1* | 6/2020 | Keskar | H03K 17/6871 |
| 2024/0128977 A1* | 4/2024 | D'Souza | H03K 19/20 |
| 2024/0178756 A1* | 5/2024 | El-Markhi | H02M 1/08 |

OTHER PUBLICATIONS

International Search Report mailed on Apr. 15, 2024, PCT Application No. PCT/US2023/085724 filed Dec. 22, 2023, 3 pages.
Written Opinion mailed on Apr. 15, 2024, PCT Application No. PCT/US2023/085724 filed Dec. 22, 2023, 5 pages.

* cited by examiner

*Primary Examiner* — Kyle J Moody
(74) *Attorney, Agent, or Firm* — Valerie M. Davis; Frank D. Cimino (57) ABSTRACT

A gate driver circuit includes a pull-up circuit, a pull-down circuit, a level shifter circuit, and a drive strength control circuit. The pull-up circuit includes a pull-up output, a first signal input, and a first enable input. The pull-up output is coupled to a gate drive output. The first signal input is coupled to a drive signal input. The pull-down circuit includes a pull-down output, a second signal input, and a second enable input. The pull-down output is coupled to the gate drive output. The second signal input is coupled to the drive signal input. The level shifter circuit includes a shifter output and a drive strength input. The shifter output is coupled to the first enable input and the second enable input. The drive strength control circuit includes a drive strength output coupled to the drive strength input.

20 Claims, 6 Drawing Sheets

GATE DRIVER CIRCUIT

BACKGROUND

A DC-DC converter is an electronic circuit that converts an input direct current (DC) supply voltage into one or more DC output voltages that are higher or lower in magnitude than the input DC supply voltage. A DC-DC converter that generates an output voltage lower than the input voltage is termed a buck or step-down converter. A DC-DC converter that generates an output voltage higher than the input voltage is termed a boost or step-up converter.

Some DC-DC converter topologies include a switching transistor coupled at a switch node to an energy storage inductor/transformer. Electrical energy is transferred through the energy storage inductor/transformer to a load by alternately opening and closing the switch as a function of a switching signal. The amount of electrical energy transferred to the load is a function of the ON/OFF duty cycle of the switch and the frequency of the switching signal. DC-DC converters are widely used to power electronic devices, particularly battery powered devices, such as portable cellular phones, laptop computers, and other electronic systems in which efficient use of power is desirable.

In order to reduce switching losses in power transistors, the switching transistors must be switched on and off very rapidly. Because the switching transistor's control terminal may present significant capacitance, a gate driver circuit may be employed to buffer an input signal and drive the switching transistor's control terminal. The gate driver circuit receives a low-power input signal and buffers the input signal to produce a high-current signal that quickly charges or discharges the input capacitance of the power transistor. Examples of power transistors with which a gate driver circuit may be employed include insulated gate bipolar transistors and metal oxide semiconductor field-effect-transistors.

SUMMARY

Gate driver circuits that use a single level shifter to control both sink and source strength for a high-side switching transistor are described herein. In one example, a gate driver circuit includes a pull-up circuit, a pull-down circuit, a level shifter circuit, and a drive strength control circuit. The pull-up circuit includes a pull-up output, a first signal input, and a first enable input. The pull-up output is coupled to a gate drive output. The first signal input is coupled to a drive signal input. The pull-down circuit includes a pull-down output, a second signal input, and a second enable input. The pull-down output is coupled to the gate drive output. The second signal input is coupled to the drive signal input. The level shifter circuit includes a shifter output and a drive strength input. The shifter output is coupled to the first enable input and the second enable input. The drive strength control circuit includes a drive strength output coupled to the drive strength input.

In another example, a gate driver circuit includes a pull-up circuit, a pull-down circuit, a level shifter circuit, and a drive strength control circuit. The pull-up circuit configured to provide current to a gate drive output responsive to a drive signal at a drive signal input and an enable signal at an enable input. The pull-down circuit is configured to draw current from the gate drive output responsive to the drive signal and the enable signal. The level shifter circuit is coupled to the pull-up circuit and the pull-down circuit. The level shifter circuit is configured to generate the enable signal by level shifting a drive strength control signal. The drive strength control circuit is coupled to the level shifter circuit. The drive strength control circuit is configured to set the drive strength control signal to a first state or a second state for an edge of the drive signal.

In a further example, a DC-DC converter circuit includes a high-side transistor, a low-side transistor, a modulation circuit, and a high-side gate driver circuit. The high-side transistor has a control terminal. The low-side transistor coupled to the high-side transistor. The modulation circuit is coupled to the high-side transistor and the low-side transistor. The modulation circuit is configured to generate a modulation signal. The high-side gate driver circuit is coupled between the high-side transistor and the modulation circuit. The high-side gate driver circuit includes a pull-up circuit, a pull-down circuit, a level shifter circuit, and a drive strength control circuit. The pull-up circuit is configured to provide current to the control terminal responsive to the modulation signal and an enable signal. The pull-down circuit is configured to draw current from the control terminal of the high-side transistor responsive to the modulation signal and the enable signal. The level shifter circuit is coupled to the pull-up circuit and the pull-down circuit. The level shifter circuit is configured to generate the enable signal by level shifting a drive strength control signal. The drive strength control circuit is coupled to the level shifter circuit. The drive strength control circuit is configured to set the drive strength control signal to a first state or a second state for an edge of the modulation signal.

DETAILED DESCRIPTION

Efficiency is an important consideration in DC-DC converters. To increase efficiency, gate drivers provide rapid turn-on and turn-off of the DC-DC converter power transistors, and the power transistors provide low on resistance. However, rapid turn-on and turn-off increases ringing, which increases the drain-source voltage ($V_{DS}$) across the power transistors. The power transistors may be damaged if the $V_{DS}$ exceeds the transistor's safe operating voltage. Power transistor breakdown voltage may fall in conjunction with specific on-resistance, which increases the likelihood of transistor damage due to ringing overvoltage.

Ringing and stress on the power transistors increase when powering larger loads. To protect the power transistors, ringing can be controlled by reducing driver strength when loading increases. In the gate driver that controls high-side power transistor switching, level shifters translate logic signals controlling drive strength (e.g., high or low drive strength) from a low voltage domain to a high voltage domain. Some high-side gate driver circuits provide individual control of drive strength during turn-on and turn-off of the high-side power transistor using two level shifters.

One level shifter controls the drive strength used to turn on the high-side transistor, and the other level shifter controls the drive strength used to turn off the high-side power transistor. The use of two level shifters increases circuit area and cost.

The gate driver circuit described herein uses a single level shifter to individually control drive strength for turning a high-side power transistor on and off. A drive strength control circuit generates an enable signal based on load related state signals. The enable signal may enable higher or lower drive strength only during high-side power transistor turn-on, only during high-side power transistor turn-off, or during both turn-on and turn-off. Turn-on and turn-off drive strength may be selected by a drive code stored in the gate driver circuit.

Figure 1:
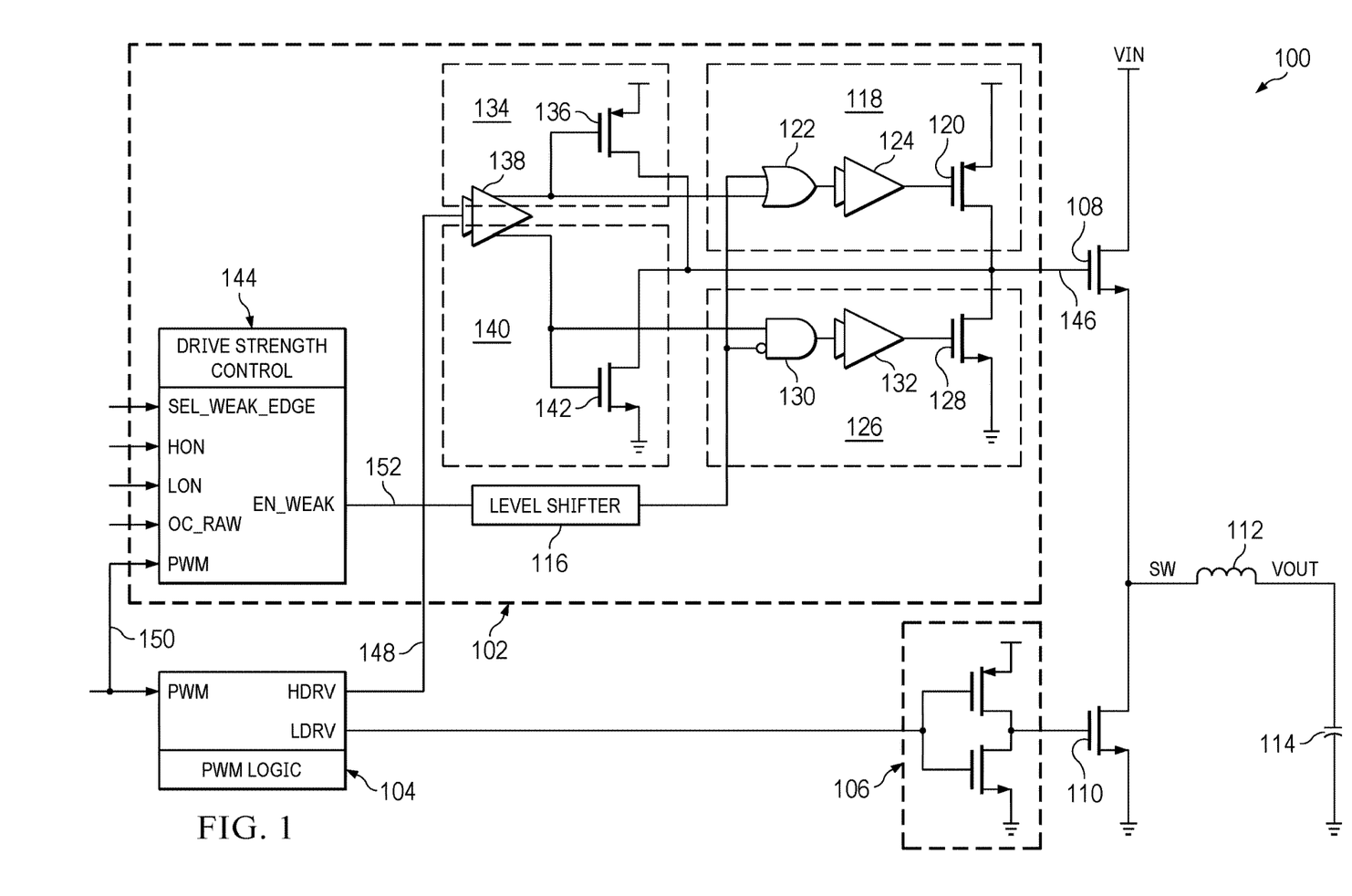
FIG. 1 is a schematic level diagram of an example gate driver circuit with a single level shifter applied in a DC-DC converter.

FIG. 1 is a schematic level diagram of an example gate driver circuit 102 applied in a DC-DC converter 100. To promote clarity, various components (e.g., output feedback circuitry) of DC-DC converter 100 have been omitted from FIG. 1. More specifically, in the DC-DC converter 100, a high-side transistor 108, a low-side transistor 110, an inductor 112, and an output capacitor 114 are shown. The high-side transistor 108 and the low-side transistor 110 may be n-channel metal oxide semiconductor field effect transistors (MOSFETs). A drain of the high-side transistor 108 is coupled to a power voltage terminal. A source of the high-side transistor 108 is coupled to the inductor 112, and the inductor 112 is coupled to the output capacitor 114. A drain of the low-side transistor 110 is coupled to the source of the high-side transistor 108, and the source of the low-side transistor 110 is coupled to a ground terminal. The gate of the high-side transistor 108 is coupled to the gate driver circuit 102. The gate of the low-side transistor 110 is coupled to a gate driver 106. A pulse width modulation (PWM) logic circuit 104 is coupled to the gate driver circuit 102 and the gate driver 106 to control switching of the high-side transistor 108 and the low-side transistor 110. The PWM logic circuit 104 receives a PWM signal 150 provided by a pulse width modulator (not shown), and generates the high-side drive signal (HDRV) and the low-side drive signal (LDRV) based on the PWM signal 150.

The gate driver circuit 102 is coupled between the PWM logic circuit 104 and the high-side transistor 108. The gate driver circuit 102 includes a level shifter circuit 116, pull-up circuit 118, a pull-down circuit 126, a pull-up circuit 134, a pull-down circuit 140, and a drive strength control circuit 144. The pull-up circuit 118 and the pull-up circuit 134 source current to a gate drive terminal 146 and the gate of the high-side transistor 108 to turn on the high-side transistor 108. The pull-down circuit 126 and the pull-down circuit 140 sink current from the gate drive terminal 146 and the gate of the high-side transistor 108 to turn off the high-side transistor 108.

The pull-up circuit 134 and the pull-down circuit 140 are coupled to the PWM logic circuit 104 via a drive signal input 148 of the gate driver circuit 102. The pull-up circuit 134 includes a transistor 136 and driver 138. The transistor 136 is a pull-up transistor and includes a first current terminal (e.g., source) coupled to the power supply terminal, and a second current terminal (e.g., drain) coupled to the gate drive terminal 146. A control terminal (e.g., gate) of the transistor 136 is coupled to a first output of the driver 138. The pull-down circuit 140 includes a transistor 142 coupled to the driver 138. The transistor 142 is a pull-down transistor and includes a first current terminal (e.g., drain) coupled to the gate drive terminal 146 and a second current terminal (e.g., source) coupled to a ground terminal. A control terminal (e.g., gate) of the transistor 142 is coupled to a second output of the driver 138. An input of the driver 138 is coupled to the drive signal input 148 and the PWM logic circuit 104. The transistor 136 may be a p-channel field effect transistor (PFET), and the transistor 142 may be an n-channel field effect transistor (NFET).

The pull-up circuit 118 and the pull-down circuit 126 are coupled to the drive signal input 148 via the driver 138. The pull-up circuit 118 includes a transistor 120, a driver 124, and a logic gate 122. The transistor 120 is a pull-up transistor includes a first current terminal (e.g., source) coupled to the power supply terminal, and a second current terminal (e.g., drain) coupled to the gate drive terminal 146. A control terminal (e.g., gate) of the transistor 120 is coupled to an output of the driver 124. An input of the driver 124 is coupled to an output of the logic gate 122. A first input of the logic gate 122 is coupled to the drive signal input 148 via the driver 138. A second input of the logic gate 122, serves as an enable input of the pull-up circuit 118, and is coupled to an output of the level shifter circuit 116. In the example of the pull-up circuit 118 shown in FIG. 1, the logic gate 122 turns on the transistor 120 based on the output of the driver 138 and the output of the level shifter circuit 116 being logic low. The output of the level shifter is an enable signal that when logic low allows the transistor 120 to drive the high-side transistor 108. The transistor 120 may be a PFET.

The pull-down circuit 126 includes a transistor 128, a driver 132, and a logic gate 130. The transistor 128 is a pull-down transistor and includes a first current terminal (e.g., drain) coupled to the gate drive terminal 146, and a second current terminal (e.g., source) coupled to the ground terminal. A control terminal (e.g., gate) of the transistor 128 is coupled to an output of the driver 132. An input of the driver 132 is coupled to an output of the logic gate 130. A first input of the logic gate 130 is coupled to the drive signal input 148 via the driver 138. A second input of the logic gate 130, serves as an enable input of the pull-down circuit 126, and is coupled to the output of the level shifter circuit 116. In the example of the pull-down circuit 126 shown in FIG. 1, the logic gate 130 turns on the transistor 128 based on the output of the driver 138 being logic high and the output of the level shifter circuit 116 being logic low. The output of the level shifter is an enable signal that that when logic low allows the transistor 128 to drive the high-side transistor 108. The transistor 128 may be an NFET.

An input of the level shifter circuit 116 is coupled to a drive strength output of the drive strength control circuit 144. The drive strength control circuit 144 generates a drive strength control signal 152. The level shifter circuit 116 shifts the drive strength control signal 152 from a low voltage domain of the drive strength control circuit 144 to the high voltage domain of the pull-up circuit 118 and the pull-down circuit 126. The drive strength control circuit 144 activates the drive strength control signal 152 to enable or disable the pull-up circuit 118 and the pull-down circuit 126 for each edge (rising and falling edge) of the PWM signal 150 based on the load powered by the DC-DC converter 100, and an edge control value stored in the gate driver circuit 102. When the pull-up circuit 118 is enabled, turn on drive strength is greater than when the pull-up circuit 118 is disabled. When the pull-down circuit 126 is enabled, turn off drive strength is greater than when the pull-down circuit 126 is disabled. By default, both the pull-up circuit 118 and the pull-down circuit 126 are enabled to provide fast turn-on and turn-off.

In one example of the gate driver circuit 102, the drive strength control circuit 144 controls drive strength as shown Table 1. In Table 1, "OC" is overcurrent. The drive strength control circuit 144 may provide different driver strength control in other examples.

TABLE 1

| Edge Control Value | Driver Strength | | Strength Control Signal | |
|---|---|---|---|---|
| | Turn-on | Turn-off | Turn-on | Turn-off |
| 00 | Slow | Slow | 1 | 1 |
| 01 | Fast | Fast | 0 | 0 |
| 10 | Fast | Slow on OC | 0 | 1 on OC |
| 11 | Slow on OC | Slow on OC | 1 on OC | 1 on OC |

Figure 2:
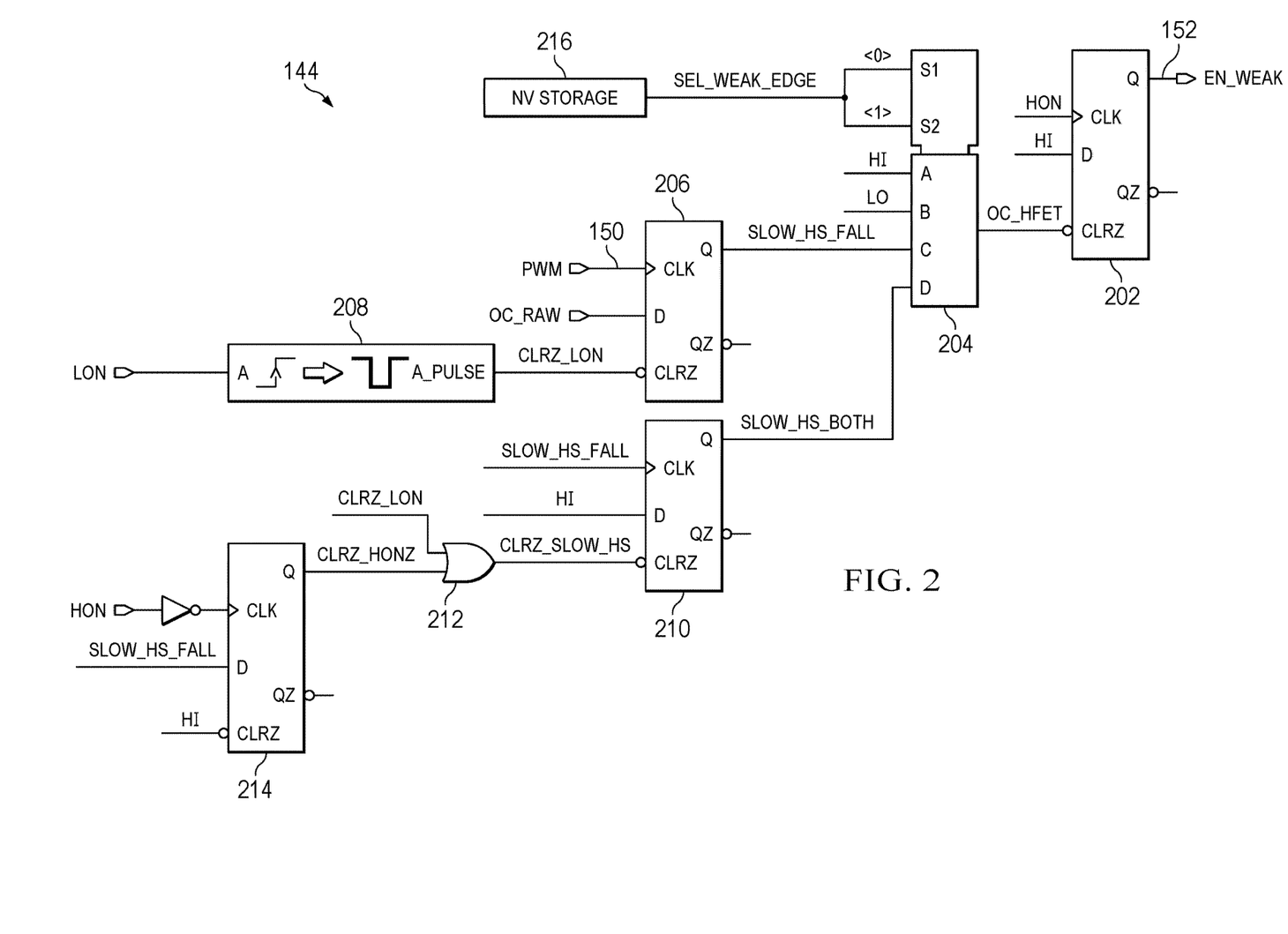
FIG. 2 is a block diagram of an example drive strength control circuit suitable for use in the gate driver circuit of FIG. 1.

FIG. 2 is a block diagram of an example drive strength control circuit 144. The drive strength control circuit 144 includes a high-on (HON) input, an edge selection (SEL_WEAK_EDGE) input, a low-on (LON) input, a PWM input, an overcurrent (OC_RAW) input, a latch 202, a selector circuit 204, a latch 206, a pulse generation circuit 208, a latch 210, a logic gate 212, and a latch 214. A high-on (HON) signal received at the high-on input indicates whether the gate-to-source voltage of the high-side transistor 108 is sufficient to turn on the high-side transistor 108. A low-on signal received at the low-on input indicates whether the gate-to-source voltage of the low-side transistor 110 is sufficient to turn on the low-side transistor 110. The PWM signal 150 is received at the PWM input. The overcurrent signal (OC_RAW) received at the overcurrent input indicates that the DC-DC converter 100 is heavily loaded, and the current flowing to the load exceeds a predetermined threshold. The edge selection input may be a multi-bit edge selection input that receives an edge control value (e.g., a multibit edge control value, SEL_WEAK_EDGE) that indicates whether high or low drive strength should be applied to turn on the high-side transistor 108 and turn off the high-side transistor 108.

The latch 202 may be a d-type flip-flop, and generates the drive strength control signal 152 provided to the level shifter circuit 116. The latch 202 includes a latch output coupled to the input of the level shifter circuit 116. A clock input of the latch 202 is coupled to the high-on input. A data input of the latch 202 is coupled to logic high voltage source (e.g., a logic high voltage terminal). A reset input of the latch 202 is coupled to a selector output of the selector circuit 204. For any switching cycle, if the reset input of the latch 202 is logic high, then the drive strength control signal 152 is set high on a rising edge of the high-on signal. This enables lower drive strength for turn-on and turn-off of consecutive cycles until the reset input of the latch 202 is set logic low by output of the selector circuit 204. The selector circuit 204 includes a selection control input (e.g., a multi-bit selection control input) coupled to the output of a non-volatile memory 216 (or a register coupled to the non-volatile memory 216) for receipt of the edge control value. The selector circuit 204 routes signal from one of its data inputs to its output based on the edge control value. A first selector input of the selector circuit 204 is coupled to a logic high voltage source. A second selector input of the selector circuit 204 is coupled to a logic low voltage source (e.g., a logic low voltage terminal or a ground terminal). A third selector input of the selector circuit 204 is coupled to an output of the latch 206. A fourth selector input of the selector circuit 204 is coupled to an output of the latch 210. Some implementations of the selector circuit 204 may include a different number of selector inputs.

If the edge control value selects connection of the first data input of the selector circuit 204 to the output of the selector circuit 204, then the latch 202 is never reset (until the edge control value is changed), and the drive strength control signal 152 disables the pull-up circuit 118 and the pull-down circuit 126 at both edges of the PWM signal 150 to provide slow turn-on and slow turn-off of the high-side transistor 108.

If the edge control value selects connection of the second data input of the selector circuit 204 to the output of the selector circuit 204, then the latch 202 is always reset (until the edge control value is changed), and the drive strength control signal 152 enables the pull-up circuit 118 and the pull-down circuit 126 at both edges of the PWM signal 150 to provide fast turn-on and fast turn-off of the high-side transistor 108.

If the edge control value selects connection of the third data input of the selector circuit 204 to the output of the selector circuit 204, then the selector circuit 204 routes the output of the latch 206 to the reset input of the latch 202. The latch 206 may be d-type flip-fop, and includes a clock input coupled to the PWM input, a data input coupled to the overcurrent input, and a reset input coupled to an output of the pulse generation circuit 208. A pulse input of the pulse generation circuit 208 is coupled to the low-on input. The pulse generation circuit 208 provides a pulse (a low-going pulse) at a pulse output responsive to a rising edge of the low-on signal. The output (SLOW_HS_FALL) of the latch 206 is set at the rising edge of the PWM signal 150 if the overcurrent signal is high and reset at the rising edge of the low-on signal. Based on the output of the latch 206, when overcurrent is detected, the drive strength control signal 152 enables the pull-up circuit 118 at the rising edge of the low-on signal and disables the pull-down circuit 126 at the rising edge of the high-on signal to provide fast turn-on and slow turn-off of the high-side transistor 108. Operation of the drive strength control circuit 144 when the selector circuit 204 selects the output of the latch 206 is further discussed with reference to FIG. 3.

If the edge control value selects connection of the fourth data input of the selector circuit 204 to the output of the selector circuit 204, then the selector circuit 204 routes the output of the latch 210 to the reset input of the latch 202. The latch 210 may be a d-type flip-flop, and includes a clock input coupled to the output of the latch 206, and a data input coupled to the logic high voltage source. A reset input of the latch 210 is coupled to the output (gate output) of the logic gate 212. A first input of the logic gate 212 is coupled to the output of the pulse generation circuit 208. A second input of the logic gate 212 is coupled to an output of the latch 214. The latch 214 may be a d-type flip-flop, and includes a clock input coupled to the high-on input via an inverter, and a data input coupled to the output of the latch 206. The output (SLOW_HS_BOTH) of the latch 210 is set at the rising edge of SLOW_HS_FALL (output by the latch 206), indicating that an overcurrent condition is present, and remains set until reset by the output of the latch 214. The output of the latch 214 is set at the falling edge of the high-on signal if SLOW_HS_FALL is high, indicating that an overcurrent condition is present, and remains set while the overcurrent condition persists. SLOW_HS_BOTH remains high as long as the output of the latch 214 is high. When the output of the latch 214 goes low, SLOW_HS_BOTH is reset. Based on the output of the latch 210, the drive strength control signal 152 disables the pull-up circuit 118 and pull-down circuit 126 at the rising edge of the high-on signal for all consecutive cycles while an overcurrent condition is present, after which the pull-up circuit 118 and pull-down circuit 126 are enabled at the rising edge of the low-on signal. Accordingly, selecting the fourth data input of the selector circuit 204 provides slow turn-on and slow turn-off of the high-side transistor 108. Operation of the drive strength control circuit 144 when the selector circuit 204 selects the output of the latch 210 is further discussed with reference to FIG. 4.

Figure 3:
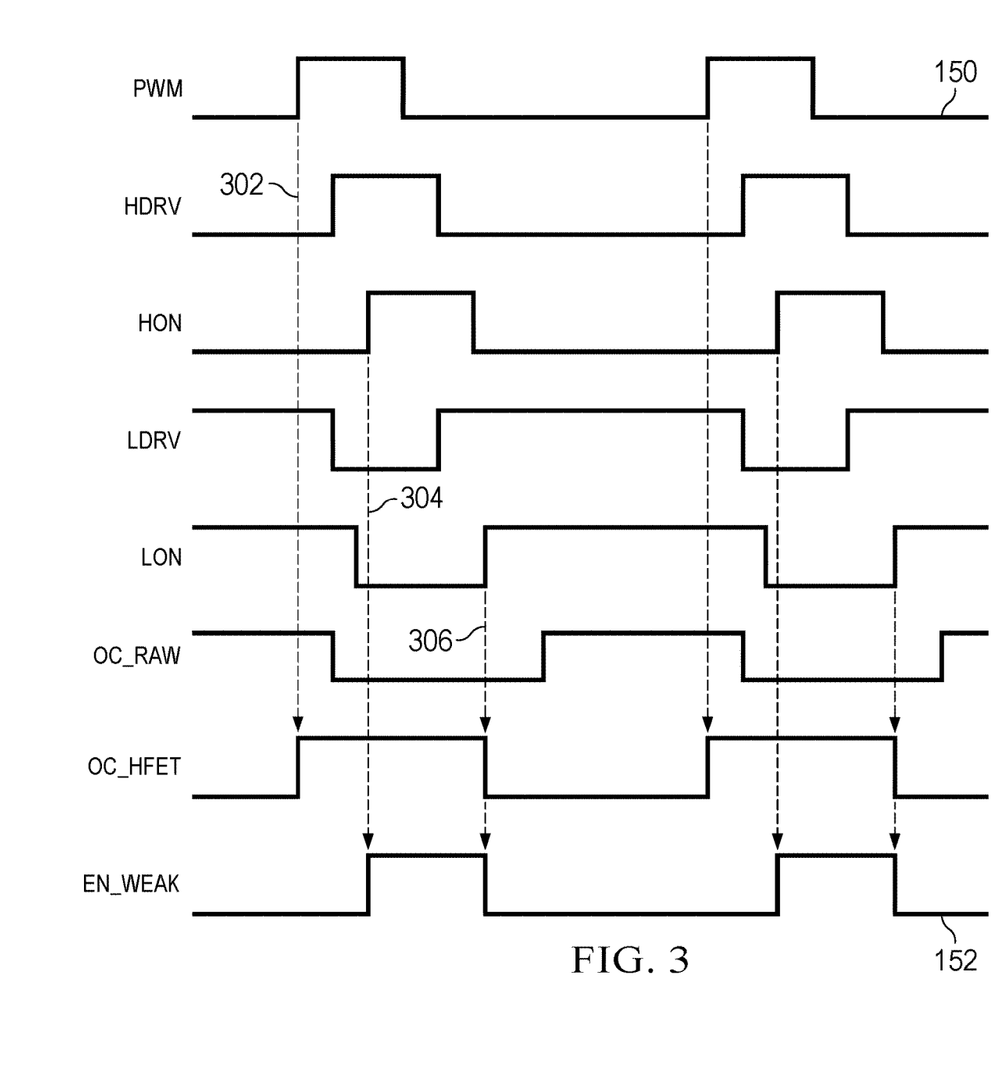
FIGS. 3-5 are timing diagrams illustrating operation of the driver strength control circuit of FIG. 2

FIG. 3 is a timing diagram illustrating operation of the drive strength control circuit 144 where drive strength is weakened only during turn-off of the high-side transistor 108 during overcurrent conditions. At the rising edge 302 of the PWM signal 150, the overcurrent signal (OC_RAW) is high in FIG. 3, which sets the latch 206. OC_HFET output by the selector circuit 204 goes high, and the latch 202 is not held reset. The latch 202 remains reset from the prior assertion of OC_HFET, and the drive strength control signal 152 is low to enable the pull-up circuit 118 while the high-side transistor 108 is turned on (shown as HDRV going high). The rising edge 304 of the high-on signal (HON) sets the latch 202, and the drive strength control signal 152 goes high to disable the pull-down circuit 126 while turning off the high-side transistor 108. At the rising edge 306 of the low-on signal (LON), the latch 206 is reset, SLOW_HS_FALL and OC_FET go low, the latch 202 is reset, and the drive strength control signal 152 goes low to enable high drive strength at the next turn-on of the high-side transistor 108.

Figure 4:
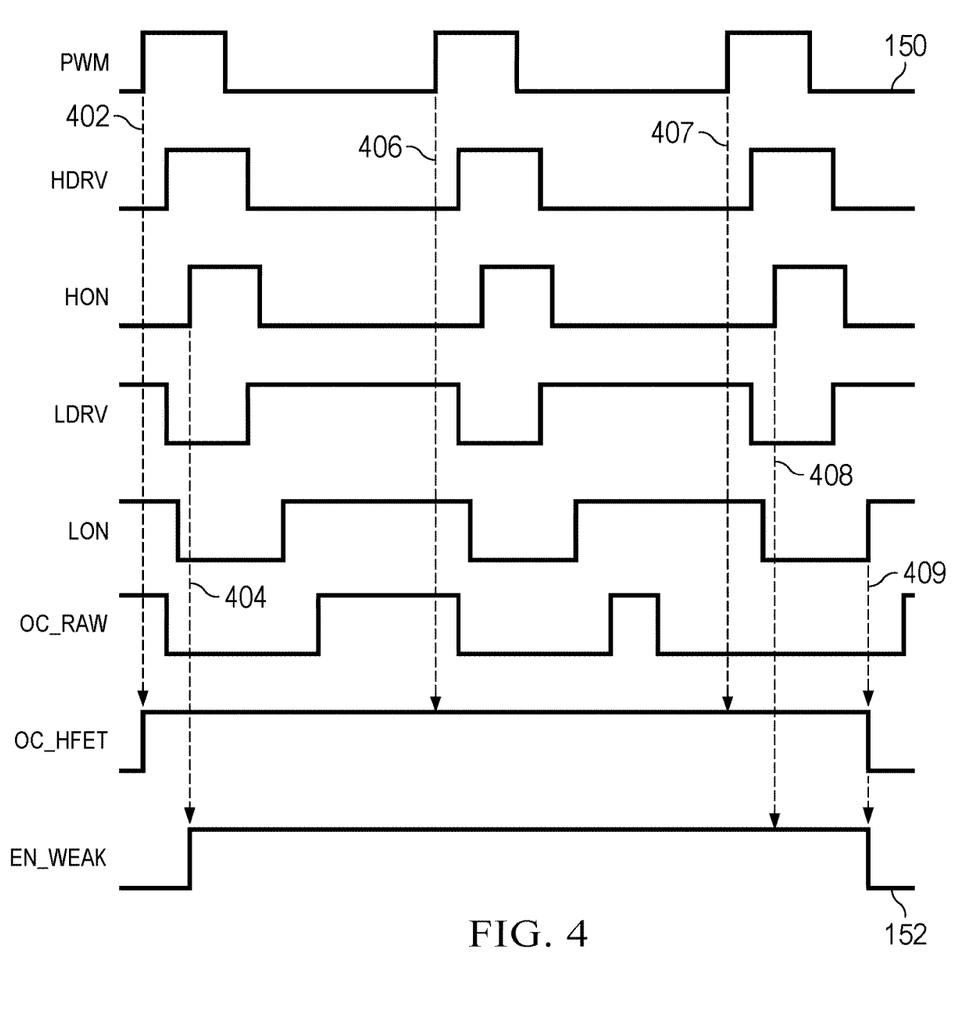

FIG. 4 is a timing diagram illustrating operation of the drive strength control circuit 144 where drive strength is weakened during both turn-on and turn-off of the high-side transistor 108 under overcurrent conditions. At the rising edge 402 of the PWM signal 150, the overcurrent signal (OC_RAW) is high in FIG. 4, which sets the latch 206. The rising edge of SLOW_HS_FALL output by the latch 206, sets the latch 210. SLOW_HS_BOTH generated by the latch 210 goes high, OC_HFET output by the selector circuit 204 goes high, and the latch 202 is not held reset. The latch 202 remains reset from the prior assertion of OC_HFET, and the drive strength control signal 152 is low to enable the pull-up circuit 118 while the high-side transistor 108 is turned on in the initial PWM cycle of FIG. 4 (shown as HDRV going high).

SLOW_HS_BOTH and the drive strength control signal 152 remain high until the rising edge of the low-on signal subsequent to the overcurrent signal being low at the rising edge of the PWM signal 150. At rising edge 406 of the drive strength control signal 152, the overcurrent signal is high, so OC_HFET and the drive strength control signal 152 remain high to disable the pull-up circuit 118 and pull-down circuit 126. At rising edge 407 of the drive strength control signal 152, the overcurrent signal is low, and SLOW_HS_FALL remains low. At the falling edge 408 of the high-on signal, the latch 214 is reset, and at the rising edge 409 of the low-on signal, the latch 210 is reset. OC_HFET goes low, the latch 202 is reset, and the drive strength control signal 152 goes low to enable the pull-up circuit 118 for high drive strength at the next turn-on of the high-side transistor 108.

Figure 5:
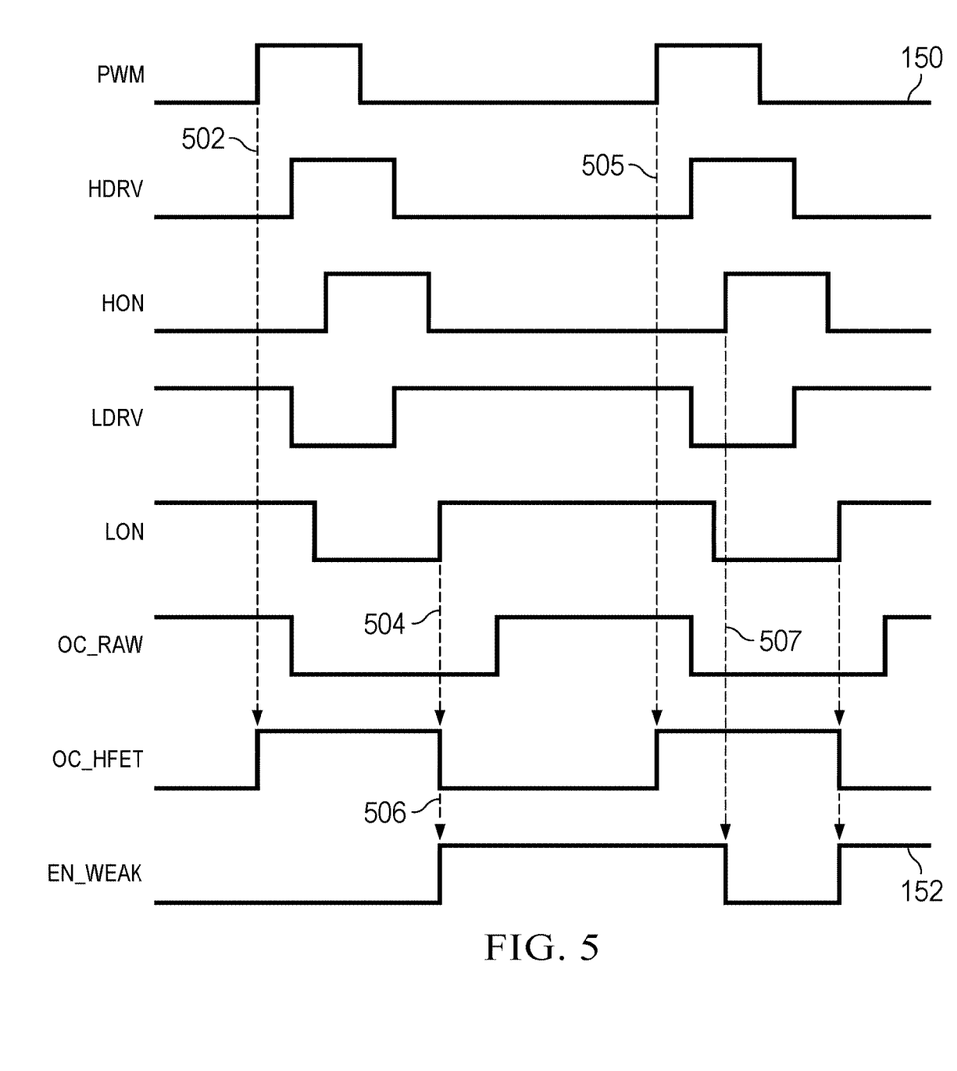

FIG. 5 is a timing diagram illustrating operation of an implementation of the drive strength control circuit 144 that provides weak drive strength only during turn-on of the high-side transistor 108. At the rising edge 502 of the PWM signal 150, the overcurrent signal (OC_RAW) is high in FIG. 5, and OC_HFET goes high. After the low-side transistor 110 is turned on, as indicated by the rising edge 504 of the low-on signal, OC_HFET goes low and the drive strength control signal 152 goes high to disable the pull-up circuit 118 at the next turn on of the high-side transistor 108.

At the rising edge 505 of the PWM signal 150, the overcurrent signal is high, and OC_HFET goes high. At the rising edge 507 of the high-on signal, the turn on of the high-side transistor 108 with weakened gate drive is complete, and the drive strength control signal 152 goes low to enable turn off of the high-side transistor 108 with high drive strength.

Figure 6:
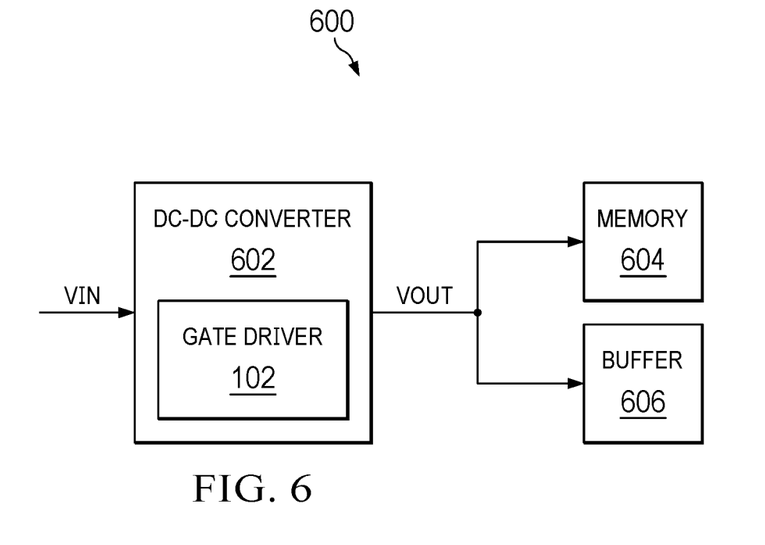
FIG. 6 is a block diagram of an example memory module that includes a DC-DC converter with the gate driver circuit of FIG. 1.

FIG. 6 is a block diagram of an example memory module 600. The memory module 600 includes a DC-DC converter 602, memory 604, and buffer circuit 606. The DC-DC converter 602 receives an input voltage VIN and generates an output voltage VOUT for powering the memory 604 and/or the buffer circuit 606. The buffer circuit 606 may include static or dynamic random-access memory. The buffer circuit 606 may buffer signals provided between the memory 604 and a module input/output interface (not shown). The DC-DC converter 602 includes the gate driver circuit 102 to provide variable drive strength to a high-side switching transistor of the DC-DC converter 602 to reduce ringing while employing a single level shifter to reduce circuit area and cost.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors, or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "on" means that the conduction channel of the FET is present and drain current may flow through the FET. References herein to a FET being "off" means that the conduction channel is not present and drain current does not flow through the FET. An "off" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. A gate driver circuit having a drive signal input, a gate drive output, a power supply terminal, and a ground terminal, the gate driver circuit comprising:
   a pull-up circuit having first and second terminals and first and second inputs, the first terminal coupled to the power supply terminal, the second terminal coupled to the gate drive output, the first input coupled to the drive signal input;
   a pull-down circuit having first and second terminals first and second inputs, the first terminal of the pull-down circuit coupled to the ground terminal, the second terminal of the pull-down circuit coupled to the gate drive output, the first input of the pull-down circuit coupled to the drive signal input;
   a level shifter circuit having an output coupled to the second input of the pull-up circuit and to the second input of the pull down circuit, and having an input; and
   a drive strength control circuit having an output coupled to the input of the level shifter circuit.

2. The gate driver circuit of claim 1, wherein the pull-up circuit includes:
   a transistor having a first terminal, a second terminal, and a control terminal, in which:
      the first terminal is coupled to the power supply terminal; and
      the second terminal is coupled to the gate drive output; and
   a logic gate having an output, a first input, and a second input, in which:
      the first input is coupled to the drive signal input;
      the second input is coupled to the output of the level shifter circuit; and
      the output is coupled to the control terminal.

3. The gate driver circuit of claim 1, wherein the pull-down circuit includes:
   a transistor having a first terminal, a second terminal, and a control terminal, in which:
      the first terminal is coupled to the gate drive output; and
      the second terminal is coupled to the ground terminal; and
   a logic gate having an output, a first input, and a second input, in which:
      the first input is coupled to the drive signal input;
      the second input is coupled to the output of the level shifter circuit; and
      the output is coupled to the control terminal.

4. The gate driver circuit of claim 1, wherein:
   the pull-up circuit is a first pull-up circuit; and
   the gate driver circuit includes a second pull-up circuit including:
      a transistor having a first terminal, a second terminal, and a control terminal, in which:
         the first terminal is coupled to the power supply terminal;
         the second terminal is coupled to the gate drive output; and
         the control terminal is coupled to the drive signal input.

5. The gate driver circuit of claim 1, wherein:
   the pull-down circuit is a first pull-down circuit; and
   the gate driver circuit includes a second pull-down circuit including:
      a transistor having a first terminal, a second terminal, and a control terminal, in which:

the first terminal is coupled to the gate drive output;
the second terminal is coupled to the ground terminal; and
the control terminal is coupled to the drive signal input.

6. The gate driver circuit of claim 1, wherein the drive strength control circuit includes:
a high-on input;
a multi-bit edge selection input;
a first latch including:
a first latch output coupled to the drive strength output;
a first clock input coupled to the high-on input;
a first data input coupled to a logic high voltage terminal; and
a first reset input; and
a selector circuit including:
a selector output coupled to the first reset input;
a multi-bit selection control input coupled to the multi-bit edge selection input;
a first selector input coupled to a logic low voltage terminal; and
a second selector input coupled to the logic high voltage terminal.

7. The gate driver circuit of claim 6, wherein:
the selector circuit includes a third selector input; and
the drive strength control circuit includes:
a pulse width modulation (PWM) input;
an overcurrent input;
a low-on input;
a second latch including:
a second latch output coupled to the third selector input;
a second clock input coupled to the PWM input;
a second data input coupled to the overcurrent input; and
a second reset input; and
a pulse generation circuit including:
a pulse input coupled to the low-on input; and
a pulse output coupled to the second reset input.

8. The gate driver circuit of claim 7, wherein:
the selector circuit includes a fourth selector input; and
the drive strength control circuit includes:
a third latch including:
a third latch output;
a third clock input coupled to the high-on input; and
a third data input coupled to the second latch output; and
a fourth latch including:
a fourth latch output coupled to the fourth selector input;
a fourth clock input coupled to the second latch output;
a fourth data input coupled to the logic high voltage terminal; and
a fourth reset input coupled to the pulse output and the third latch output.

9. A gate driver circuit, comprising:
a pull-up circuit configured to provide current to a gate drive output responsive to a drive signal at a drive signal input and an enable signal at an enable input;
a pull-down circuit configured to draw current from the gate drive output responsive to the drive signal and the enable signal;
a level shifter circuit coupled to the pull-up circuit and the pull-down circuit, the level shifter circuit configured to generate the enable signal by level shifting a drive strength control signal; and a drive strength control circuit coupled to the level shifter circuit, the drive strength control circuit configured to set the drive strength control signal to a first state or a second state for an edge of the drive signal;
wherein:
the gate driver circuit is configured to provide an edge control value; and
the drive strength control circuit is configured to set the drive strength control signal to the first state or the second state based on the edge control value.

10. The gate driver circuit of claim 9, wherein:
the pull-up circuit is a first pull-up circuit;
the pull-down circuit is a first pull-down circuit; and
the gate driver circuit includes:
a second pull-up circuit configured to provide current to the gate drive output responsive to the drive signal; and
a second pull-down circuit configured to draw current from the gate drive output responsive to the drive signal.

11. The gate driver circuit of claim 9, wherein:
the first state disables the pull-up circuit and the pull-down circuit;
the second state enables the pull-up circuit and the pull-down circuit; and
the drive strength control circuit is configured to set the drive strength control signal to the first state during a rising edge of the drive signal and during a falling edge of the drive signal based on the edge control value.

12. The gate driver circuit of claim 9, wherein:
the first state disables the pull-up circuit and the pull-down circuit;
the second state enables the pull-up circuit and the pull-down circuit; and
the drive strength control circuit is configured to set the drive strength control signal to the second state during a rising edge of the drive signal and during a falling edge of the drive signal based on the edge control value.

13. The gate driver circuit of claim 9, wherein:
the first state disables the pull-up circuit and the pull-down circuit;
the second state enables the pull-up circuit and the pull-down circuit; and
the drive strength control circuit is configured to set the drive strength control signal to the second state during a rising edge of the drive signal and to the first state during a falling edge of the drive signal based on the edge control value.

14. The gate driver circuit of claim 9, wherein:
the first state disables the pull-up circuit and the pull-down circuit;
the second state enables the pull-up circuit and the pull-down circuit; and
the drive strength control circuit is configured to set the drive strength control signal to the first state during a rising edge of the drive signal and to the second state during a falling edge of the drive signal based on the edge control value.

15. A DC-DC converter circuit, comprising:
a high-side transistor having a control terminal;
a low-side transistor coupled to the high-side transistor;
a modulation circuit having a first output coupled to the low-side transistor and having a second output and an input, the modulation circuit configured to generate a modulation signal;

a drive strength control circuit having an input coupled to the input of the modulation circuit, the drive strength control circuit configured to set a drive strength control signal, at an output of the drive strength control circuit, to a first state or a second state for an edge of the modulation signal;

a level shifter circuit having an input coupled to the output of the drive strength control circuit, the level shifter circuit configured to generate, at an output of the level shifter circuit, an enable signal by level shifting the drive strength control signal;

a high-side gate driver circuit including:
- a pull-up circuit having a terminal coupled to the control terminal of the high-side transistor, a first input coupled to the second output of the modulation circuit and a second input coupled to the output of the level shifter circuit, the pull-up circuit configured to provide current to the control terminal responsive to the modulation signal and an enable signal; and
- a pull-down circuit having a terminal coupled to the control terminal of the high- side transistor, a first input coupled to the second output of the modulation circuit and a second input coupled to the output of the level shifter circuit, the pull-down circuit configured to draw current from the control terminal of the high-side transistor responsive to the modulation signal and the enable signal.

16. The DC-DC converter circuit of claim 15, wherein:
the pull-up circuit is a first pull-up circuit;
the pull-down circuit is a first pull-down circuit; and
the high-side gate driver circuit includes:
- a second pull-up circuit configured to provide current to the control terminal of the high-side transistor responsive to the modulation signal; and
- a second pull-down circuit configured to draw current from the control terminal of the high-side transistor responsive to the modulation signal.

17. The DC-DC converter circuit of claim 15, wherein:
the high-side gate driver circuit is configured to store an edge control value; and
the drive strength control circuit is configured to set the drive strength control signal to the first state or the second state based on the edge control value.

18. The DC-DC converter circuit of claim 17, wherein:
the first state disables the pull-up circuit and the pull-down circuit;
the second state enables the pull-up circuit and the pull-down circuit; and
the drive strength control circuit is configured to set the drive strength control signal to the second state during a rising edge of the modulation signal and to the first state during a falling edge of the modulation signal based on the edge control value.

19. The DC-DC converter circuit of claim 17, wherein:
the first state disables the pull-up circuit and the pull-down circuit;
the second state enables the pull-up circuit and the pull-down circuit; and
the drive strength control circuit is configured to set the drive strength control signal to the first state during a rising edge of the modulation signal and to the second state during a falling edge of the modulation signal based on the edge control value.

20. A driver circuit having a drive signal input and a gate drive output, the driver circuit comprising:
a first transistor having a terminal coupled to the gate drive output and having a control terminal; and
a first logic gate having an output coupled to the control terminal of the first transistor, having a first input coupled to the drive signal input, and having a second input;
a second transistor having a terminal coupled to the gate drive output and having a control terminal; and
a second logic gate having an output coupled to the control terminal of the second transistor, having a first input coupled to the drive signal input, and having a second input;
a level shifter circuit having an output coupled to the second input of the first logic gate and to the second input of the second logic gate, and having an input; and
a drive strength control circuit having an output coupled to the input of the level shifter circuit.

* * * * *